(12) United States Patent
Johnson

(10) Patent No.: US 7,541,852 B2
(45) Date of Patent: Jun. 2, 2009

(54) SELF-CORRECTING BUFFER

(75) Inventor: Luke A. Johnson, Queen Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 11/646,661

(22) Filed: Dec. 28, 2006

(65) Prior Publication Data
US 2008/0157841 A1 Jul. 3, 2008

(51) Int. Cl.
*H03K 5/12* (2006.01)
(52) U.S. Cl. .................. 327/175; 327/172; 330/259
(58) Field of Classification Search ......... 327/171–176; 330/258–260
See application file for complete search history.

(56) References Cited
U.S. PATENT DOCUMENTS

| | | | | |
|---|---|---|---|---|
| 4,280,175 A * | 7/1981 | Leuthold | ............... | 363/127 |
| 4,564,821 A * | 1/1986 | Reichart | ............... | 331/74 |
| 5,113,090 A * | 5/1992 | Imaizumi et al. | ............... | 327/69 |
| 5,166,632 A * | 11/1992 | MacKenzie | ............... | 327/323 |
| 5,491,441 A * | 2/1996 | Goetschel et al. | ............... | 327/291 |
| 5,565,800 A * | 10/1996 | Kobayashi | ............... | 327/65 |
| 5,708,376 A * | 1/1998 | Ikeda | ............... | 327/50 |
| 5,883,535 A * | 3/1999 | Kato | ............... | 327/170 |
| 6,215,333 B1* | 4/2001 | Kuttner | ............... | 327/67 |
| 2007/0115050 A1* | 5/2007 | Blon | ............... | 330/69 |

\* cited by examiner

*Primary Examiner*—An T Luu
(74) *Attorney, Agent, or Firm*—Ryder IP Law; Douglas J. Ryder

(57) ABSTRACT

In general, in one aspect, the disclosure describes an apparatus having a capacitor to receive an input signal and to block DC portion of the incoming signal. A buffer is used to receive the DC blocked incoming signal and output an outgoing signal. A low pass filter is used to convert duty cycle error in an outgoing signal to a DC offset and to provide the DC offset to the capacitor. The DC offset is used to bias the capacitor. The biasing of the capacitor can adjust the DC blocked incoming signal so as to reduce the duty cycle error in the outgoing signal.

12 Claims, 9 Drawing Sheets

US 7,541,852 B2

SELF-CORRECTING BUFFER

BACKGROUND

High speed serial interfaces require a very accurate and clean clock to sample incoming data with the accuracy necessary to guarantee proper capturing of data. These high speeds make the use of an at-speed clock impractical. Many interfaces have resorted to half-rate clocks where data is sampled on both edges of the clock. This puts extremely tight requirements on the duty cycle error of the clock that reaches the samplers. Without special attention, device mismatches in a phase locked loop (PLL) and traditional clock trees can result in duty cycle error greater than acceptable limits (e.g., in excess of 10%).

FIG. 1 illustrates an example buffer 100 that may be used in a clock tree for a differential clock signal. The buffer 100 includes first, second and third transistors 110, 115, 120 and first and second resistors 130, 135. The first transistor 110 is coupled between a first voltage source (e.g., ground) 160 and the second and third transistors 115, 120. The gate of the first transistor 110 is coupled to an enable signal 165 and a reference current 170. The second and third transistors 115, 120 are coupled to the first and second resistors 130, 135 respectively; and the first and second resistors 130, 135 are coupled to a second voltage source (e.g., Vcc) 175. The gates of the second and third transistors 115, 120 receive an input signal (e.g., each transistor 115, 120 receives a different leg of the differential input signal). An output is the drain of the second and third transistors 115, 120 respectively (e.g., each transistor 115, 120 outputs a different leg of the differential output signal). The transistors 110, 115, 120 are negative channel transistors (e.g., NMOS).

The enable signal 165 controls the operation of the first transistor 110 and accordingly the connection of the second and the third transistors 115, 120 to the first source 160. Thus, the enable signal 165 is used to control the timing of the output clock signal from the second and third transistors 115, 120. The buffer 100 is used to minimize supply related noise and degradation from unmatched rise and fall times. That is, the buffer 100 is used to make the clock edges sharp. However, variations in the parameters of the devices within the buffer (e.g., between the second and third transistors 115, 120; between the first and second resistors 130, 135) that may be caused by process, voltage, or temperature (PVT) variations may increase duty cycle error for the clock.

One approach to correcting the duty cycle error is to utilize duty-cycle correctors at the end of each clock path. These duty cycle correctors must be made very large and consume large amounts of power for them to work well when statistical variation is applied.

BRIEF DESCRIPTION OF THE DRAWINGS

The features and advantages of the various embodiments will become apparent from the following detailed description in which.

DETAILED DESCRIPTION

Figure 2:
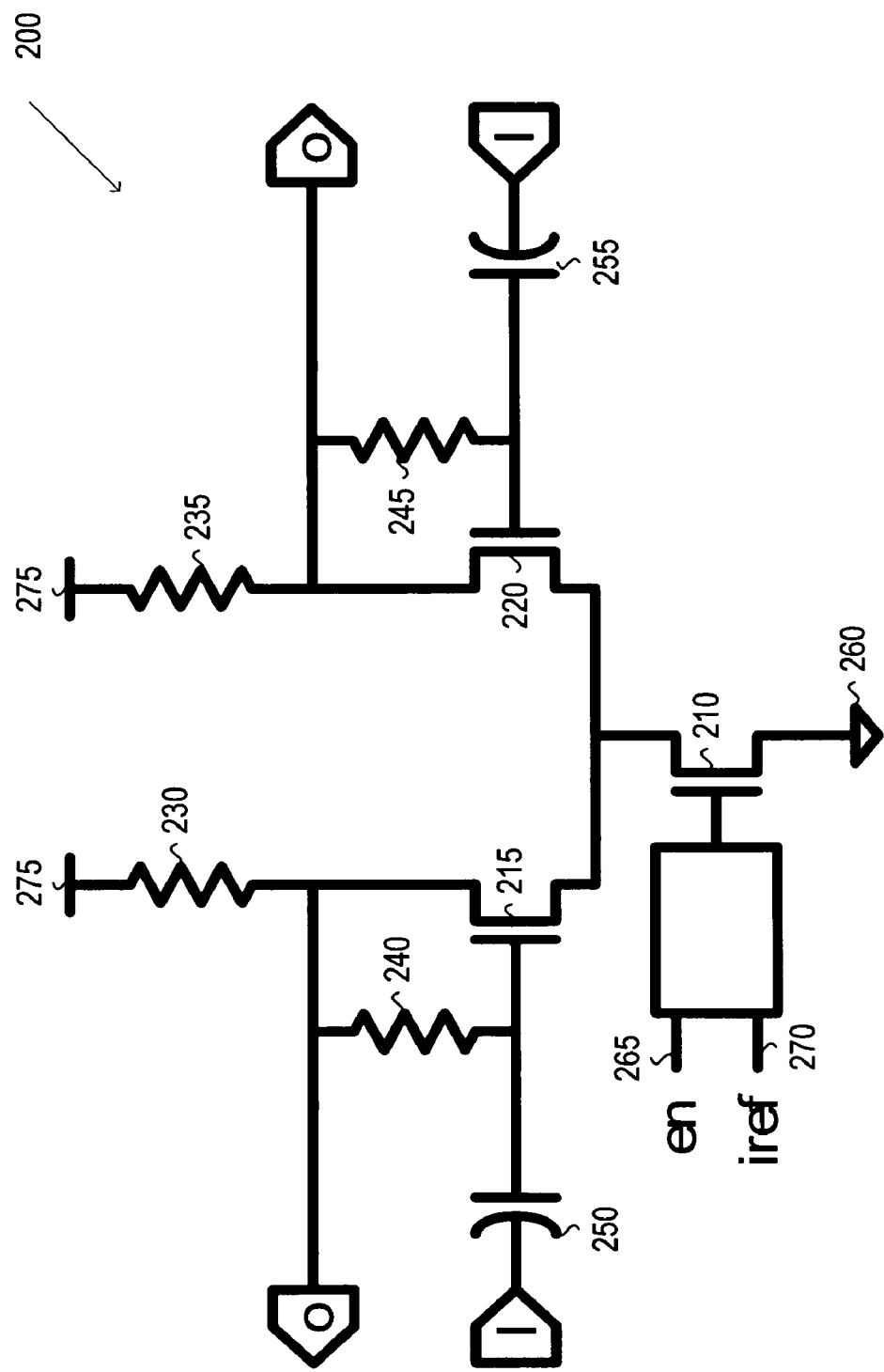
FIG. 2 illustrates an example self correcting buffer, according to one embodiment.

FIG. 2 illustrates an example self correcting buffer 200. The buffer 200 receives a differential signal (e.g., differential clock) and outputs a corrected differential signal. The buffer 200 includes first, second, and third, transistors 210, 215, 220; first, second, third and fourth resistors 230, 235, 240, 245; and first and second capacitors 250, 255. The first transistor 210 is coupled between a first voltage source (e.g., ground) 260 and the second and third transistors 215, 220. The gate of the first transistor 210 is coupled to an enable signal 265 and a reference current 270. The second and third transistors 215, 220 are coupled to the first and second resistors 230, 235 respectively; and the first and second resistors 230, 235 are coupled to a second voltage source (e.g., Vcc) 275. The gates of the second and third transistors 215, 220 are coupled to the first and second capacitors 250, 255 respectively. The third and fourth resistors 240, 245 are coupled from the gate to the drain of the second and third transistors 215, 220 respectively. An input signal is received by the first and second capacitors 250, 255 (e.g., each capacitor 250, 255 receives a different leg of the differential input signal). An output is the drain of the second and third transistors 215, 220 respectively (e.g., each transistor 215, 220 outputs a different leg of the differential output signal).

The capacitors 250, 255 block the DC portion of the incoming signal. This is beneficial since desired information in a clock is at frequency (AC portion) rather than in the DC portion (DC information is not required or desired). Additionally, device mismatch is a DC parameter. The third and fourth resistors 240, 245 act as low pass filters (LPFs) to convert duty cycle error (e.g., caused by device mismatch) to DC offset. The third and fourth resistors 240, 245 use the DC offset to bias the first and second capacitors 250, 255 respectively. Accordingly, the combination of the third and fourth resistors 240, 245 and the first and second capacitors 250, 255 reduce or cancel duty cycle errors that may be caused by device mismatches.

Figure 3:
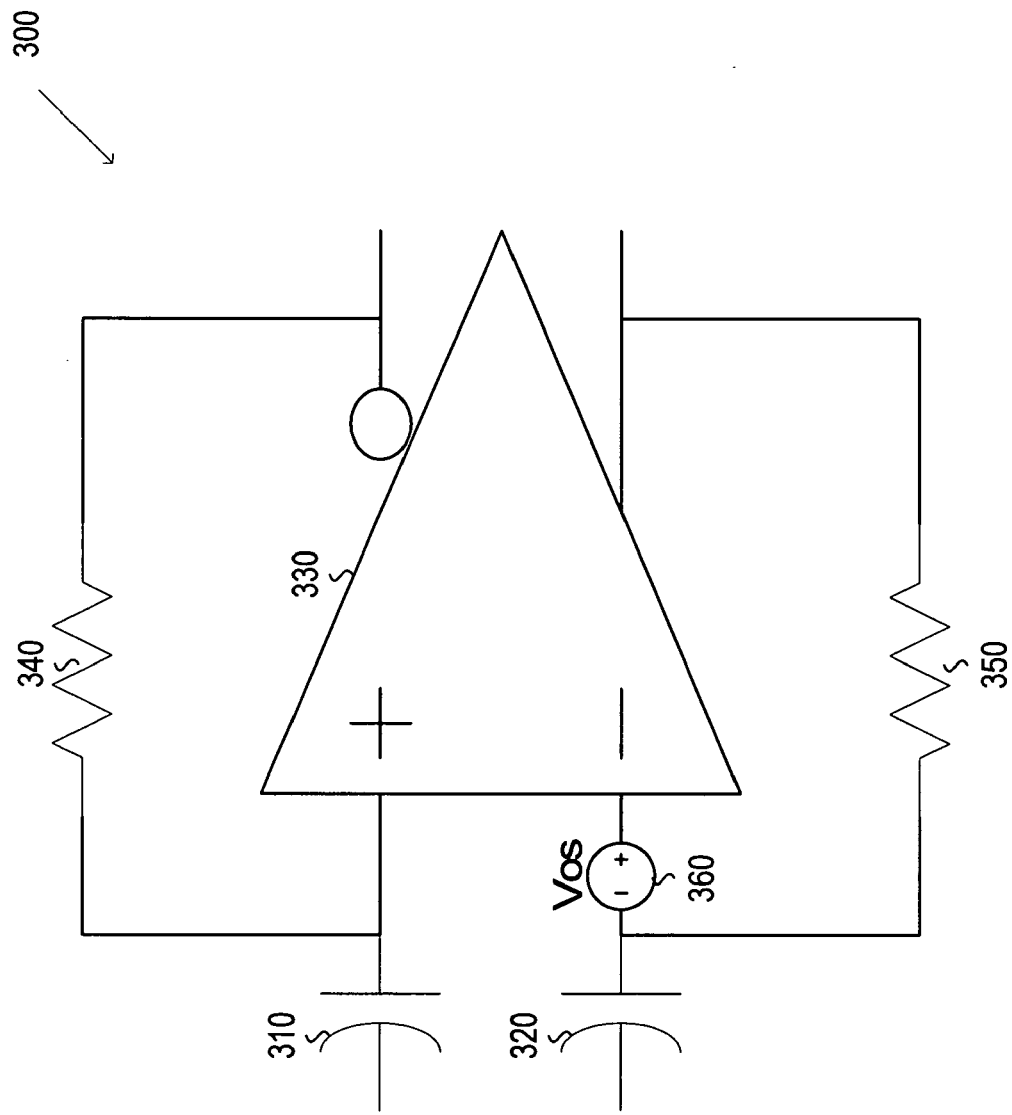
FIG. 3 illustrates an example analog circuit to assist in explaining the offset cancellation of the example self correcting buffer of FIG. 2, according to one embodiment.

FIG. 3 illustrates an example analog circuit 300 to assist in explaining the use of the third and fourth resistors 240, 245 and the first and second capacitors 250, 255 for offset cancellation (reduce/cancel duty cycle errors caused by device mismatch in the buffer). The analog circuit 300 includes first and second capacitors 310, 320, an amplifier 330, first and second resistors 340, 350, and an offset voltage source (Vos) 360. The first and second capacitors 310, 320 (blocking capacitors) receive input signals and are coupled to inputs (positive and negative) of the amplifier 330. The first and second resistors 340, 350 (feedback resistors) are coupled between the outputs and inputs of the amplifier 330 to provide feedback. The Vos 360 represents the mismatch between input signals lumped together and applied at the negative input terminal of the amplifier 330.

If the blocking capacitors 310, 320, and the feedback resistors 340, 350 were not present the Vos 360 would be amplified by the DC gain (D) of the amplifier 330, so that offset error at the output of the amplifier would be Vos*D. The blocking capacitors 310, 320 block the DC portion of the input signal and the feedback resistors 340, 350 bias the blocking capacitors 310, 320 to adjust the DC portion that is blocked. Accordingly, the blocking capacitors 310, 320 and the feedback resistors 340, 350 reduce the amplification of Vos 360 by the amplifier 330 by D+1, so that the offset error at the output of the amplifier 330 is Vos*D/D+1. It should be noted that the blocking capacitors 310, 320 and the feedback resistors 340, 350 respond to the DC gain (D) of the amplifier 360 and not the AC gain (A). As high-speed circuits benefit from the gain at the operational frequency and not DC gain, the removal of the DC gain by the blocking by the capacitors 310, 320 and the feedback resistors 340, 350 does not impair operation.

Referring back to FIG. 2, the combination of the third and fourth resistors 240, 245 and the first and second capacitors 250, 255 reduce/cancel duty cycle errors that may be caused by device mismatches in the buffer 200. Accordingly, the buffer 200 can be used to sharpen the clock edges without contributing (or at least without significantly contributing) to the duty cycle error of the clock. The utilization of the buffer 200 in a clock tree can significantly reduce duty cycle error caused by device mismatch in the clock tree.

The buffer 200 may also be utilized to cancel input duty cycle error (e.g., may be used to correct duty cycle errors present in a PLL or other clock source that drives the clock tree). That is, the third and fourth resistors 240, 245 (LPFs) work like integrators to drive the output signal to the point where the integral of the output signal is zero (area above and below bias point is equal). The low pass filter 240, 245 therefore may widen a narrow phase of the input signal and narrow a wide phase of the input signal in order to accomplish this. In addition, the feedback to the capacitors 250, 255 may affect the bias point of the input signal provided to the transistors 215, 220.

Figure 4A:
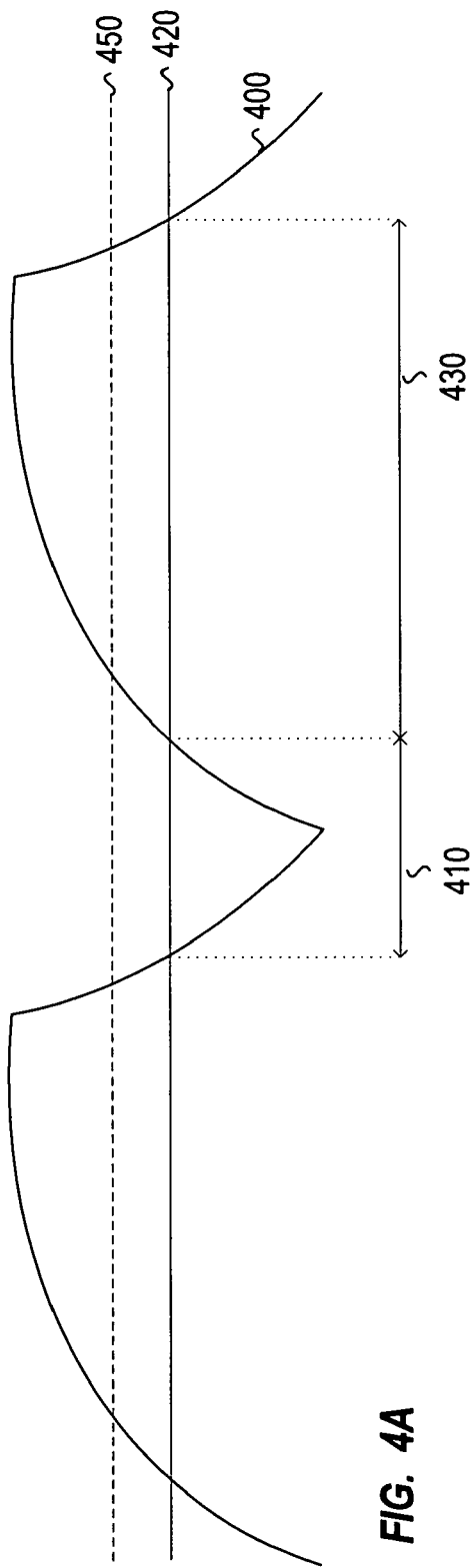
FIGS. 4A-B illustrate an example input clock signal to and output clock signal from the example self correcting buffer of FIG. 2, according to one embodiment.

FIG. 4A illustrates an example input waveform 400 (e.g., clock) with grossly exaggerated duty cycle error. The cycle 410 for a negative phase of the input waveform (portion below the zero differential (non-biased) level 420) is significantly less than the cycle 430 for a positive phase of the input waveform (portion above the zero differential level 420).

Figure 4B:
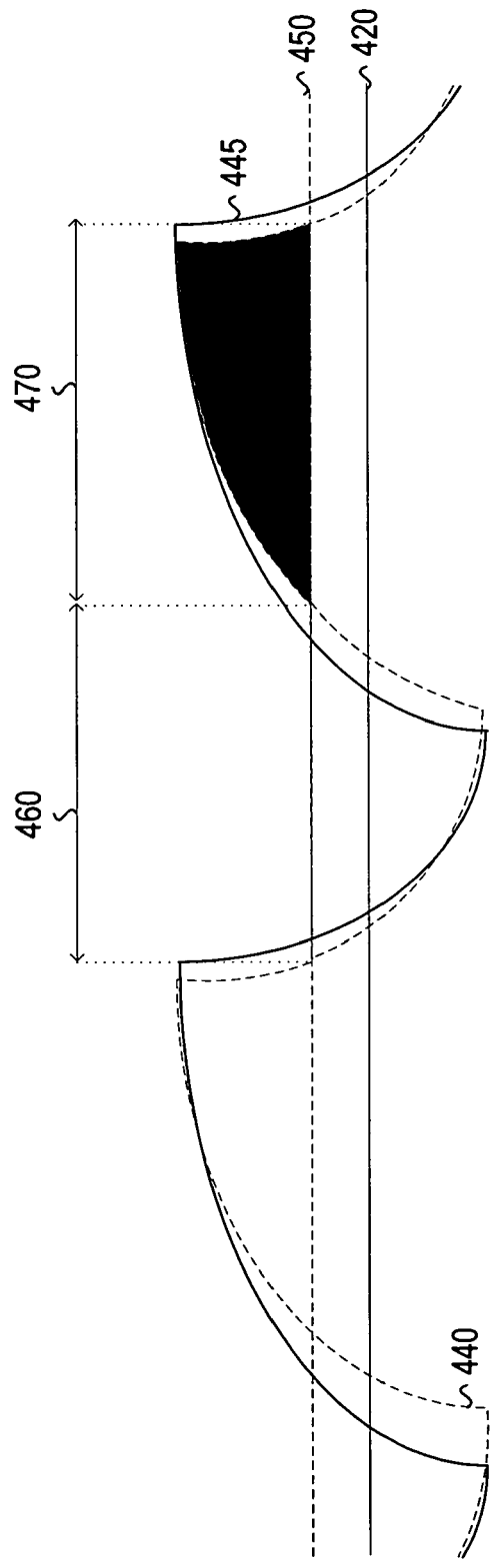

FIG. 4B illustrates an example output waveform 440 (e.g., clock). The resulting output waveform 440 is overlaid on an uncorrected output waveform 445 for comparison purposes. The output waveform 440 has the negative phase of the input waveform stretched and the positive phase narrowed by a LPF (e.g., 240, 245 of FIG. 2).

FIG. 4A illustrates a bias point 450 for the input signal 400 is shifted up based on feedback from the LPF provided to blocking capacitors (e.g., 250, 255 of FIG. 2). FIG. 4B illustrates the bias point 450 is used in determining when the integral of the output signal 440 is zero (light grey area below bias point 450 is equal to dark gray area above). As illustrated, the cycle 460 for the negative phase of the output signal (light gray area) is approximately equal to the cycle 470 for the positive phase of the output signal (dark gray portion).

FIGS. 4A-B illustrate how use of blocking capacitors (e.g., 250, 255) and low pass filters (e.g., 240, 245) in a clock buffer can be used to correct duty cycle error in an incoming clock signal. It should be noted that a single self correcting clock buffer (e.g., 200) may not be sufficient to correct large duty cycle errors. Accordingly, several self correcting clock buffers may be used.

Referring back to FIG. 2, a large amount of time is required for the blocking capacitors 250, 255 to settle to its bias point after the buffer 200 is enabled. To make the buffer 200 practical this amount of time needs to be reduced. The amount of time may be reduced by temporarily shorting out the feedback resistors 240, 245 when the buffer is powering up. This allows the capacitors 250, 255 to be charged up quickly.

Figure 5:
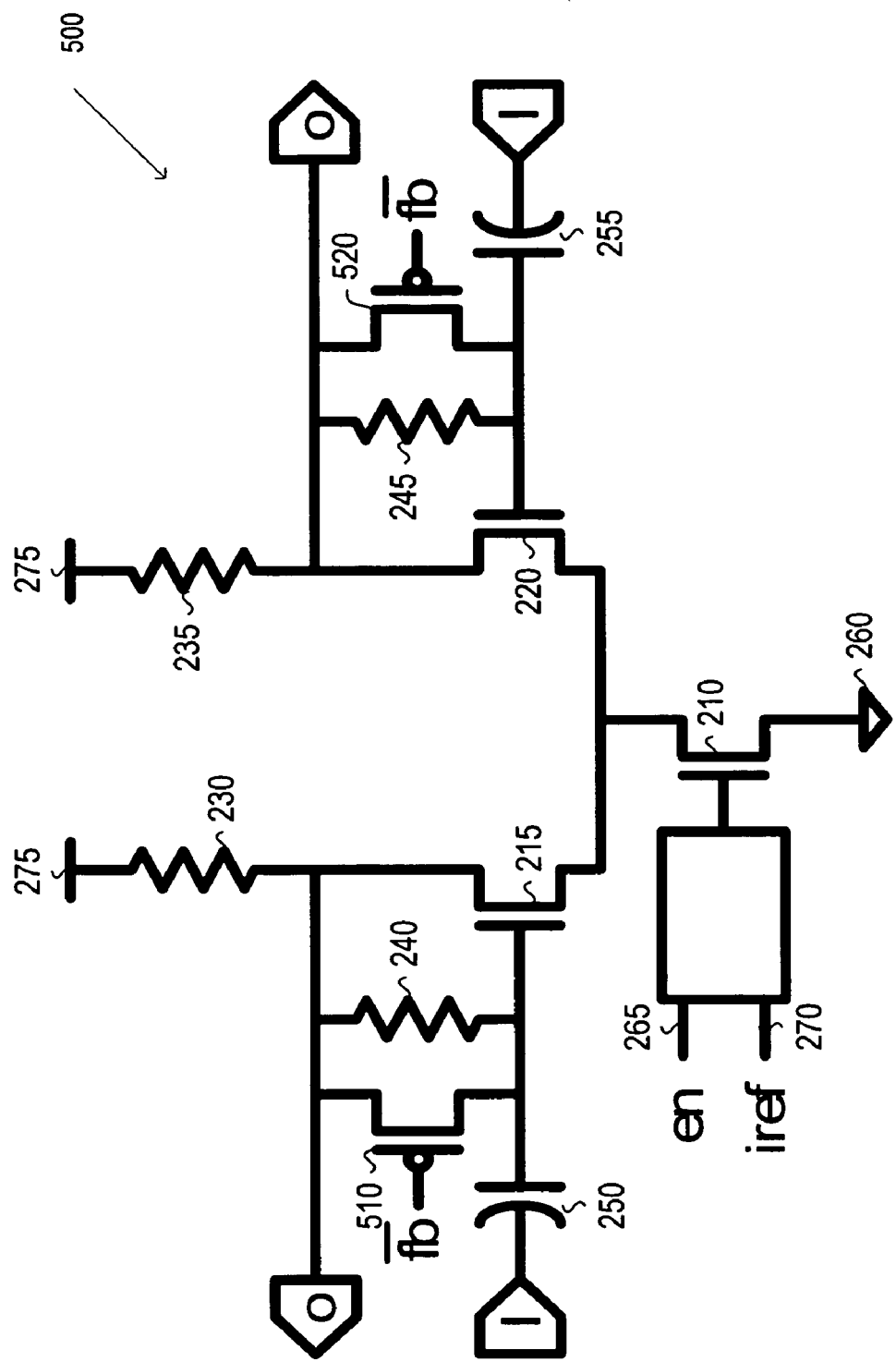
FIG. 5 illustrates an example self correcting buffer capable of reduced capacitor charge time, according to one embodiment.

FIG. 5 illustrates an example self correcting buffer 500 capable of reduced capacitor charge time. The buffer 500 may be the buffer 200 of FIG. 2 with a fourth and fifth transistor 510, 520 placed in parallel with the third and fourth resistors 240, 245 respectively. The transistors 510, 520 may be positive channel transistors (e.g., PMOS). The transistors 510, 520 receive a fast enable signal that controls the operation of the transistors 510, 520. When the fast enable signal is active the transistors 510, 520 are turned on and the feedback resistors (LPFs) 240, 245 are shorted out. While the LPFs 240, 245 are shorted, the inputs should be held at zero differential to prevent an offset error being generated on the capacitors 250, 255 when the fast bias signal is turned off. An offset error may occur when the input is not at zero differential.

Figure 1:
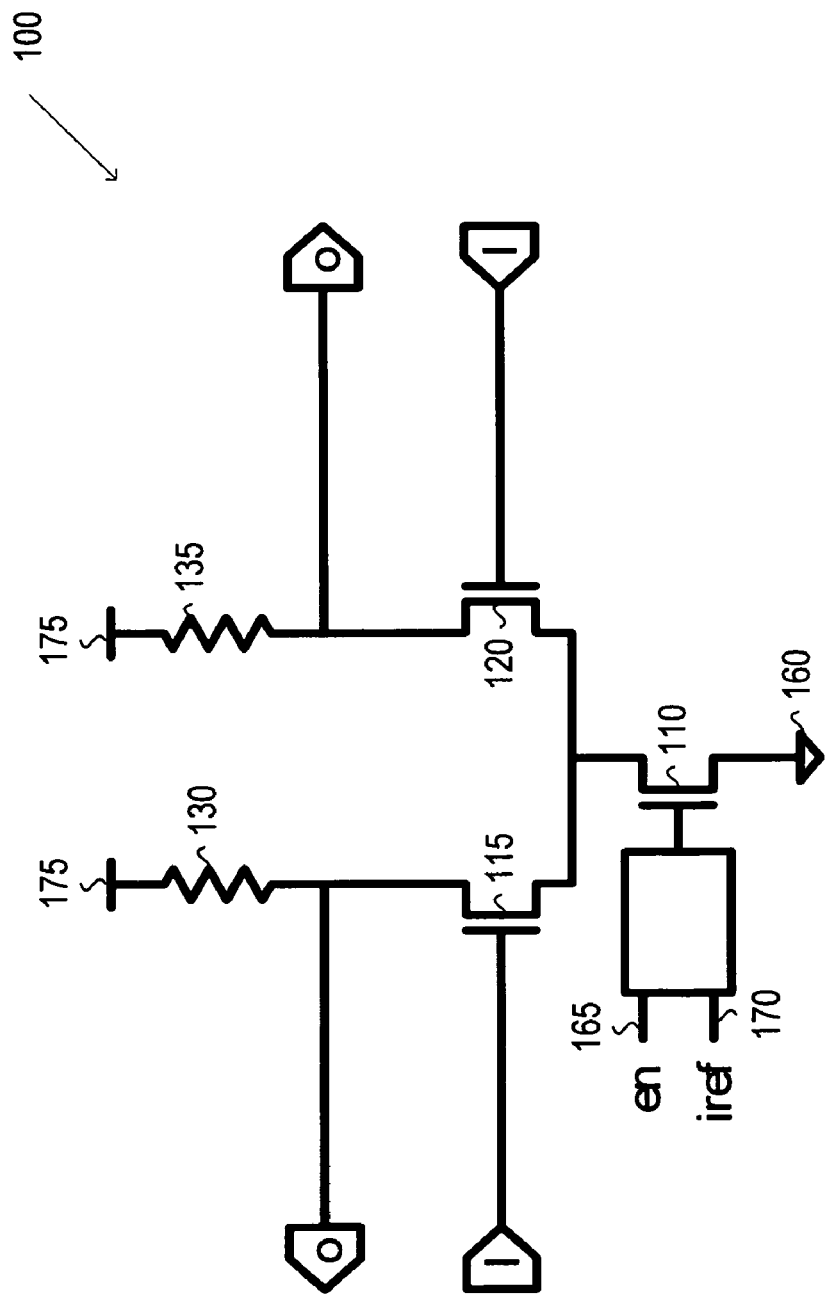
FIG. 1 illustrates an example buffer that may be used in a clock tree for a differential clock signal, according to one embodiment.
Figure 6:
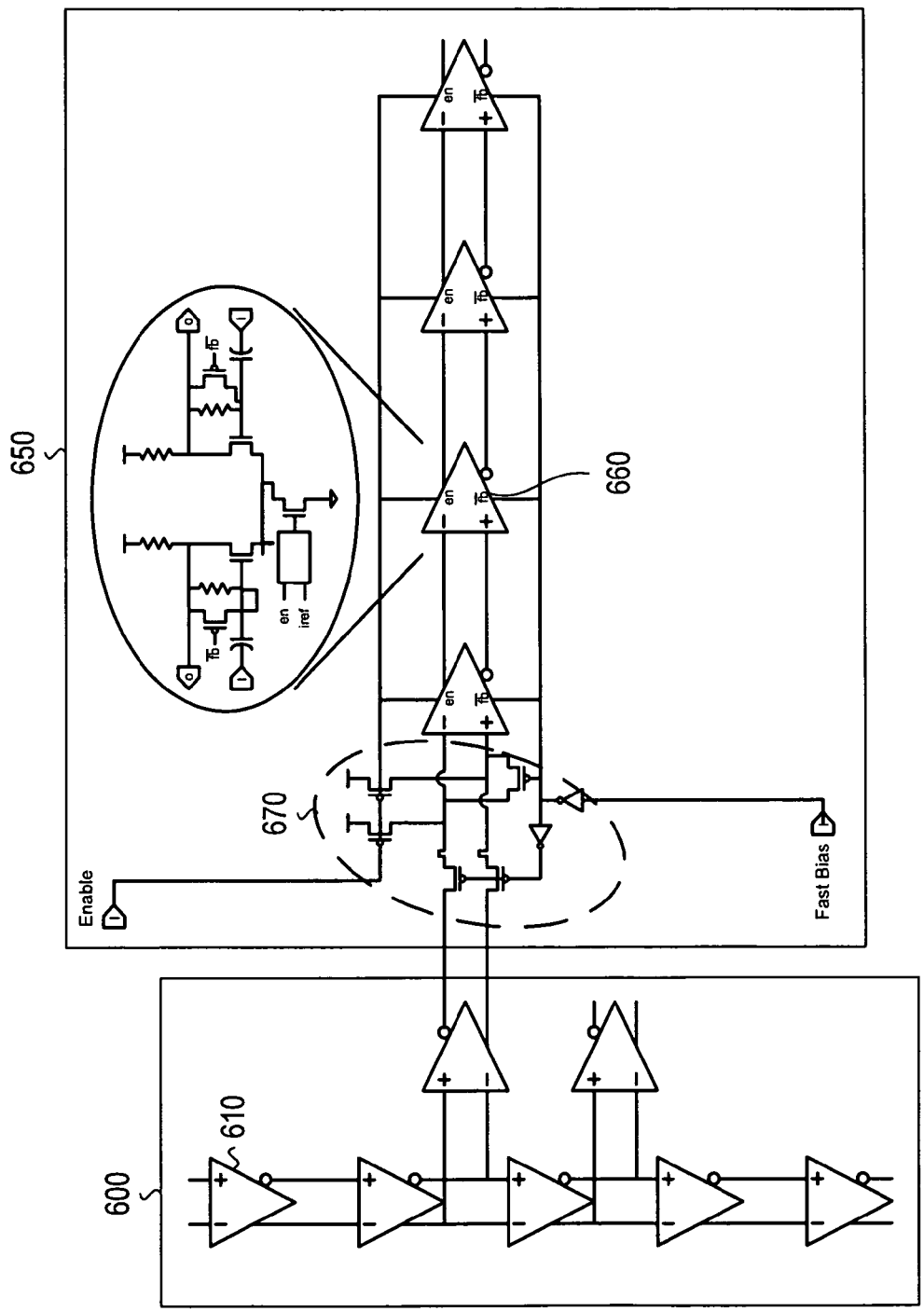
FIG. 6 illustrates an example delay locked loop (DLL) clock and a branch of a clock tree utilizing self correcting buffers, according to one embodiment.

FIG. 6 illustrates an example delay locked loop (DLL) clock 600 and one branch of a clock tree 650. The DLL 600 includes a plurality of buffers 610 and the clock tree includes a plurality of self correcting buffers 660 (e.g., 200 of FIG. 2, 500 of FIG. 5). The buffers 610 may be similar to those illustrated in FIG. 1 or may be similar to the self correcting buffers 660. Regardless of the buffers 610 used, the input and output bias levels are the same. When power is off, the transistor current source (e.g., 110 of FIG. 1, 210 of FIGS. 2/5) in the buffers 610, 660 is off and the resistor loads (e.g., 130, 135; 230, 235) in the buffers 610, 660 cause the outputs to settle to the Vdd rail (e.g., 175, 275). Devices 670 may be added in the clock tree branch 650 to pull the inputs to the Vdd rail if the buffers 610 in the DLL 600 do not pull their outputs to Vdd. The goal is to keep the voltage across the blocking capacitors (e.g., 250, 255) in the buffers 660 at zero volts so only the offset error needs to be developed at power on. Since the output bias level of the DLL buffer 610 is the same as the output of the clock buffer 660 when the tree 650 is enabled, both sides of the capacitors quickly move to the proper bias level. That is, no charge is required to be transferred into the capacitors since the voltage across the capacitors remains zero.

Figure 7:
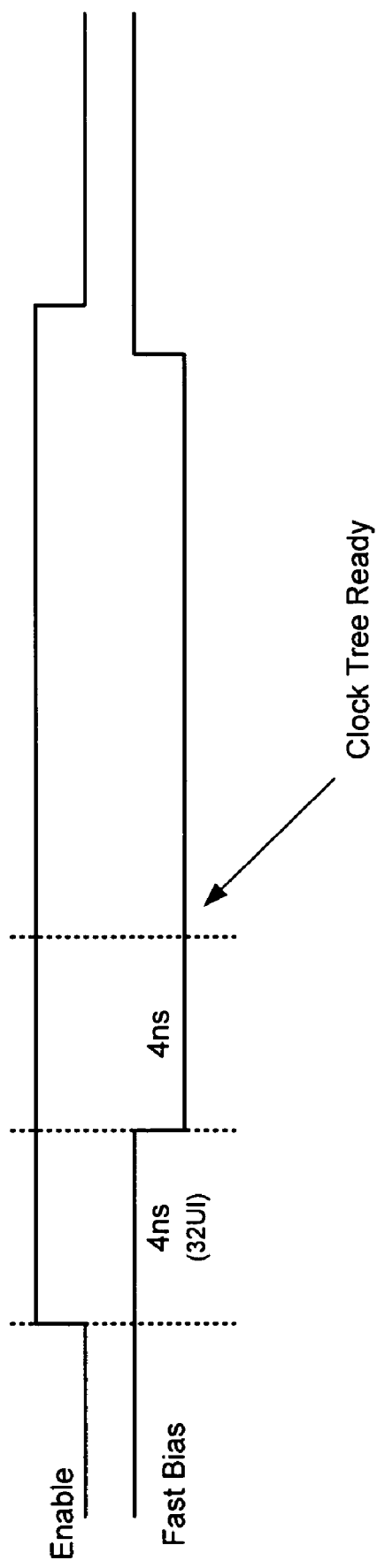
FIG. 7 illustrates an example timing diagram for starting the example clock tree of FIG. 6, according to one embodiment.

FIG. 7 illustrates an example timing diagram for starting the clock tree (e.g., 650). Initially, the fast bias signal is active so that the feedback resistors are shorted and there is no feedback differential and the enable signal is inactive so that there is no input differential either. The enable signal is turned on and the tree is enabled. The fast bias signal remains active for a period (e.g., 4 ns) after the tree is enabled to allow the capacitors to charge. Most of the device mismatch is cancelled and established on the capacitor at this time. When the fast bias mode is turned off, the clock is allowed to pass. The received duty cycle error may be corrected after a period of time (e.g., 4 ns).

It should be noted that the blocking capacitors 250, 255 and the feedback resistors 240, 245 add to the total area of the self correcting clock buffers (e.g., 200, 500). However, the total power and area for a device is reduced since using the self correcting buffers enables explicit duty-cycle correctors to be excluded. Additional power and area savings may be realized in the buffers. A traditional clock buffer uses large devices and thus lots of power to make the output signal (e.g., clock signal) edges very sharp to avoid corrupting the timing from mismatches. The self correcting buffer may enable the size of the devices to be reduced while still providing the desired performance. Due to these power and area saving the self correcting clock buffers may enable devices to handle increased clock speeds (e.g., 8 GT/s).

The disclosure has focused on differential clock signals but is not limited thereto. Rather, the self correcting buffer could be implemented on single ended clock signals. The self correcting buffers could be implemented in systems utilizing signals where no information is contained in the DC component of the signal (DC balanced schemes). For example, the self correcting buffers could be used in 8-bit to 10-bit (8B10B) data encoding used in telecommunications systems implementing standards, such as, Serial Advanced Technology Attachment (SATA), Peripheral Component Interconnect Express (PCIe), and Gigabit Ethernet (GbE).

The self correcting buffer may be implemented in devices utilizing a clock (e.g., high-speed clock) to clock data in and out (e.g., I/O device). The self correcting buffer may be implemented at the chip, board or system level.

Figure 8:
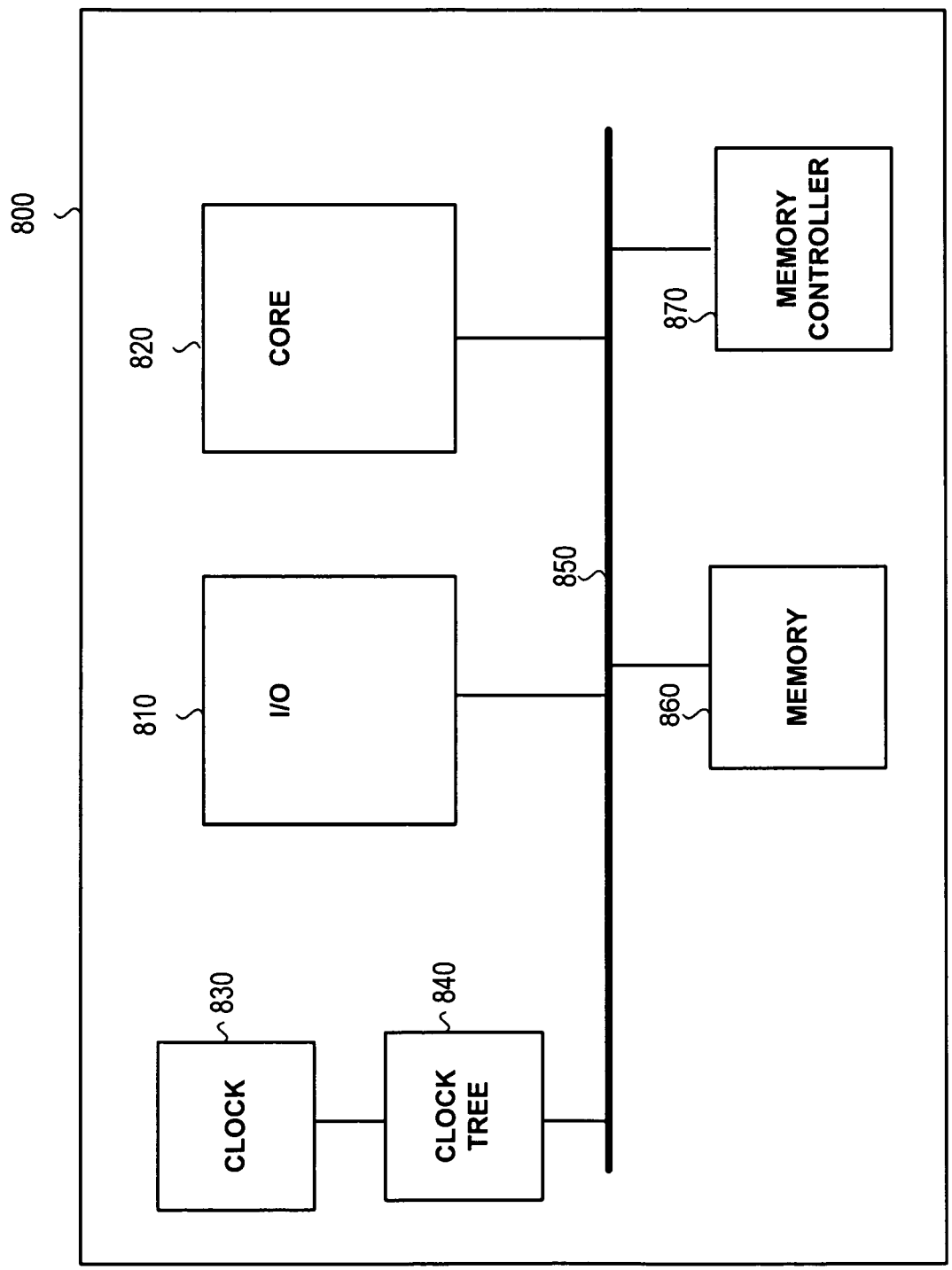
FIG. 8 illustrates a simplified block diagram of an example integrated circuit (IC) implementing the self correcting buffer in a clock tree, according to one embodiment.

FIG. 8 illustrates a simplified block diagram of an integrated circuit (IC) 800 that may implement the self correcting buffer (e.g., 200, 500). The IC 800 includes an input/output (I/O) 810, a core (processing unit) 820, a clock source 830, a clock tree 840, and a shared bus 850. The clock source 830 may generate the clock signal on the IC 800 utilizing a PLL or DLL or may receive the clock from an external source. The IC 800 may include on-die memory 860 and/or a memory controller 870 for interfacing with off-die memory. The memory controller 870 may be integrated with the core 820. The IC 800 may perform simple or complex functions. The IC 800 may be a processor (e.g., I/O processor, network processor). The I/O 810 may receive signals via physical links such as board interconnects or may receive the signals via a wireless connection. The self correcting buffer may be implemented in the clock tree 840.

The self correcting buffer may be utilized in any number of communication systems, including in wireless devices (e.g., cell phones, PDAs), network devices (e.g., switches, routers), or computer systems (e.g., servers, PCs).

Figure 9:
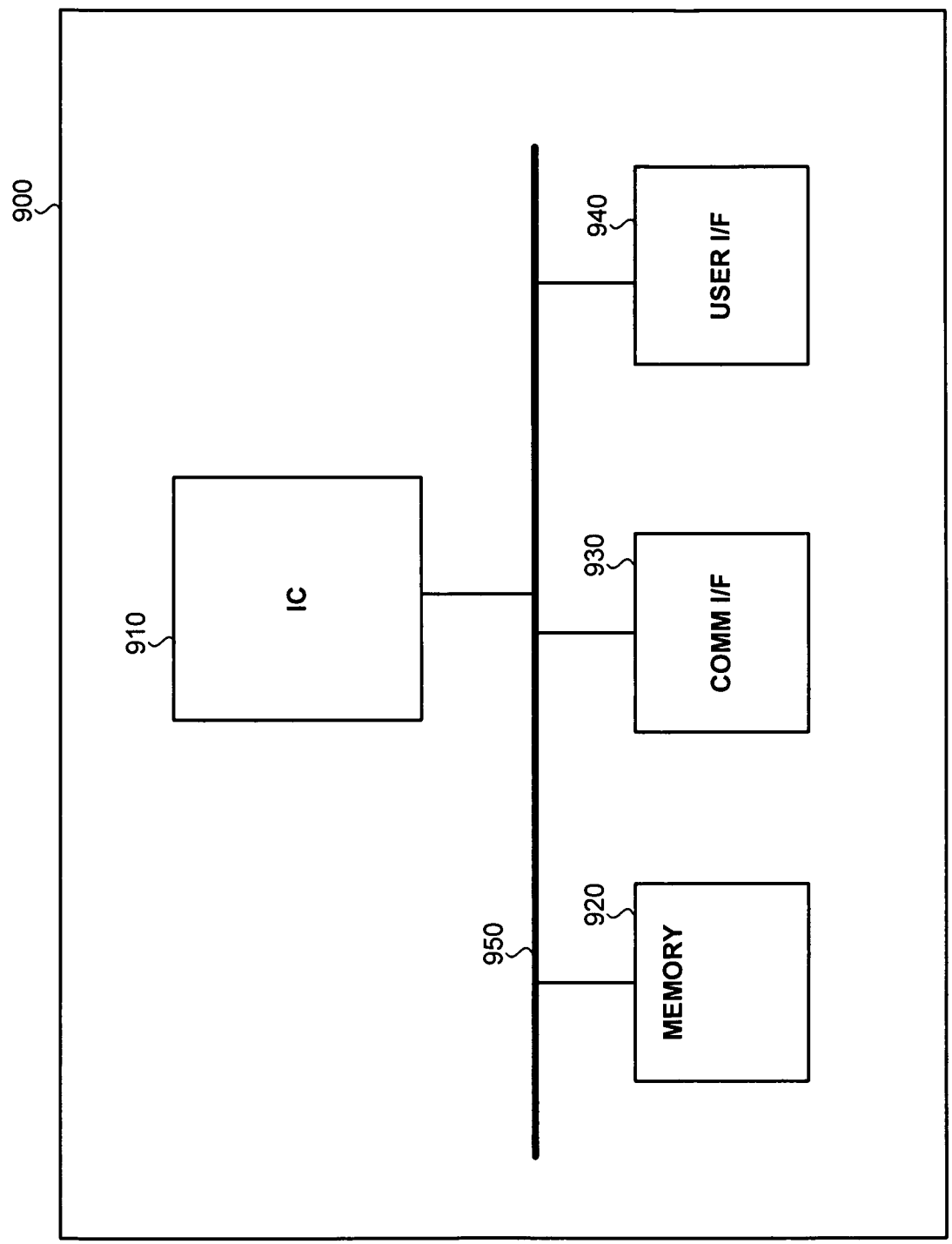
FIG. 9 illustrates a simplified block diagram of an example system that could implement the self correcting buffer in a clock tree in an IC, according to one embodiment.

FIG. 9 illustrates an example system 900 that could implement the self correcting buffer. The system 900 includes an IC 910 (e.g., I/O processor, network processor), off-die memory 920 (e.g., DDR, QDR), a communication interface 930 (e.g., physical link, wireless), and a user interface 940, connected via a shared bus 950. The self correcting buffer could be implemented in a clock tree in the IC 910.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
a capacitor to receive a first signal and to block DC portion of the first signal;
a buffer to receive the DC blocked first signal and an enable signal and to output a second signal, wherein timing of the output of the second signal is to be controlled by the enable signal;
a resistor coupled to the buffer to act as a low pass filter to convert duty cycle error in the second signal to a DC offset and to provide the DC offset to the capacitor in order to bias the capacitor, wherein the biasing of the capacitor can adjust the DC blocked first signal so as to reduce the duty cycle error in the second signal; and
a bias transistor, coupled in parallel to the resistor, to receive a bias signal, wherein the bias transistor is used to short the resistor based on the bias signal to prevent the capacitor from being improperly biased.

2. The apparatus of claim 1, wherein the duty cycle errors are due to device mismatches in the buffer.

3. The apparatus of claim 1, wherein the buffer includes a buffer transistor and the resistor is coupled from a drain of the buffer transistor to a gate of the buffer transistor.

4. The apparatus of claim 1, wherein the resistor is used to correct duty cycle errors in the first signal by driving the second signal to a point where an integral of the second signal is zero.

5. The apparatus of claim 4, wherein the resistor widens narrow phases and narrows large phases in the second signal.

6. The apparatus of claim 1, wherein the bias transistor is to short the resistor during start-up to quicken charge time of the capacitor.

7. The apparatus of claim 1, wherein the first signal and the second signal are DC balanced signals.

8. The apparatus of claim 7, wherein the DC balanced signals are clock signals.

9. The apparatus of claim 7, wherein the DC balanced signals are encoded data signals.

10. A self correcting buffer comprising
a first transistor coupled to a first voltage source, wherein the first transistor is to receive an enable signal;
a second transistor coupled to the first transistor;
a resistor coupled to the second transistor and a second voltage source;
a low pass filter coupled across the second transistor;
a capacitor coupled to the second transistor, wherein the capacitor is to receive a first signal, block a DC portion of the first signal, and provide the DC blocked first signal to the second transistor, wherein the second transistor is to generate a second signal based on the DC blocked first signal and output the second signal, wherein timing of the output of the second signal is to be based on the enable signal, wherein the low pass filter is to convert duty cycle error in the second signal to a DC offset and to provide the DC offset to the capacitor in order to bias the capacitor, wherein the biasing of the capacitor can adjust the DC blocked first signal so as to reduce the duty cycle error in the second signal; and
a third transistor coupled in parallel to the low pass filter, wherein the third transistor is to short the low pass filter to prevent the capacitor from being improperly biased during start-up to quicken capacitor charge time.

11. The buffer of claim 10, wherein the low pass filter is to drive the output signal toward a point where an integral of the output signal is zero by widening narrow phases and narrowing large phases in the output signal.

12. The buffer of claim 10, wherein the first signal and the second signal are DC balanced signals.

* * * * *